United States Patent [19]

Merrin

[11] 3,864,718

[45] Feb. 4, 1975

[54] MULTIPLE JUNCTION DEVICE EMPLOYING A GLASSY AMORPHOUS MATERIAL AS AN ACTIVE LAYER

[75] Inventor: Seymour Merrin, Fairfield, Conn.

[73] Assignee: Innotech Corporation, Norwalk, Conn.

[22] Filed: Nov. 13, 1973

[21] Appl. No.: 415,435

Related U.S. Application Data

[60] Division of Ser. No. 227,933, Feb. 22, 1972, Pat. No. 3,801,879, which is a continuation-in-part of Ser. No. 122,420, March 9, 1971, abandoned.

[52] U.S. Cl. .......................... 357/2, 357/4, 357/16, 357/30

[51] Int. Cl. .......................................... H01l 3/00

[58] Field of Search ...... 317/234 V, 235 AC, 235 N

[56] References Cited

UNITED STATES PATENTS 3,611,060 10/1971 Johnson ........................ 317/234 R

*Primary Examiner*—Martin H. Edlow

*Attorney, Agent, or Firm*—Pennie & Edmonds

[57] ABSTRACT

A semiconductive junction device comprises a thin layer of a glassy amorphous material exhibiting one type of conductivity (either N or P) disposed upon a semiconductive substrate possessing the other kind of conductivity. The glassy layer is sufficiently thin that it exhibits a useful level of conductivity. Preferably, the glassy layer is ion impermeable so that the device remains stable under a wide range of operating conditions. These junctions behave as diodes and can be incorporated in a wide variety of complex semiconductive devices.

9 Claims, 7 Drawing Figures

MULTIPLE JUNCTION DEVICE EMPLOYING A GLASSY AMORPHOUS MATERIAL AS AN ACTIVE LAYER

CROSS REFERENCE TO RELATED APPLICATIONS

This is a division, of application Ser. No. 227,933 filed Feb. 22, 1972 now U.S. Pat. No. 3,801,879, which application is a continuation-in-part of United States application Ser. No. 122,420 filed by the same inventor on Mar. 9, 1971.

BACKGROUND OF THE INVENTION

The present invention related to semiconductive junction devices employing a glassy amorphous material as an active layer.

The term glassy amorphous material, within the context of this description, defines those materials which typically exhibit only short-term ordering. The term is intended to include not only glasses, but also those "amorphous" materials which have any appreciable short-range ordering. However, it is intended to exclude both crystalline substances (such as silicon and silicon dioxide) and true amorphous materials having no appreciable ordering.

Glasses, which comprise a specific class of glassy amorphous materials, are typically quenched liquids having a viscosity in excess of about $10^8$ poise at ambient temperature. They are generally characterized by: (1) the existence of a single phase; (2) gradual softening and subsequent melting with increasing temperature, rather than sharp melting characteristics; (3) conchoidal fracture; and (4) the absence of crystalline X-ray diffraction peaks.

While the desirability of using glassy amorphous material in semiconductor devices has been long recognized, the development of semiconductor devices employing such materials has met with only limited success despite an intensive research effort. It is well known, for example, that glasses are easier to work with and less expensive compared with conventional crystalline semiconductors. However, many glassy amorphous materials are insulating materials. Thus, for example, typical oxidic glasses (glasses formed predominantly of oxide components) have not been considered useful in semiconductor devices because of their high resistivities and large band gaps.

Principally, three compositional groups of glasses have heretofore been found to possess sufficient conductivity to be classed as "semiconducting": the chalcogenide-halogenide glasses, the phosphate-borate vanadate glasses, and the electro-optical glasses. Of these special compositional glasses, only the chalcogenide-halogenide glasses have been employed in workable semiconducting devices, and these devices have generally been of the bulk type rather than the junction type.

SUMMARY OF THE INVENTION

It has been discovered that a semiconductive junction diode can be made using an active layer of a glassy amorphous material disposed upon a semiconductive substrate. Specifically, a junction device comprises a thin layer of a glassy amorphous material exhibiting one type of electronic conductivity (either N or P) disposed upon a semiconductive substrate possessing the other kind of electronic conductivity. The glassy layer is sufficiently thin that it exhibits a useful level of conductivity, and preferably the glassy layer is ion impermeable so that the device remains stable under a wide range of operating conditions.

BRIEF DESCRIPTION OF THE DRAWINGS

The advantages, nature, and various features of the present invention will appear more fully upon consideration of the illustrative embodiments now to be described in detail in connection with the accompanying drawings.

In the drawings.

DETAILED DESCRIPTION OF THE DRAWINGS

Figure 1:
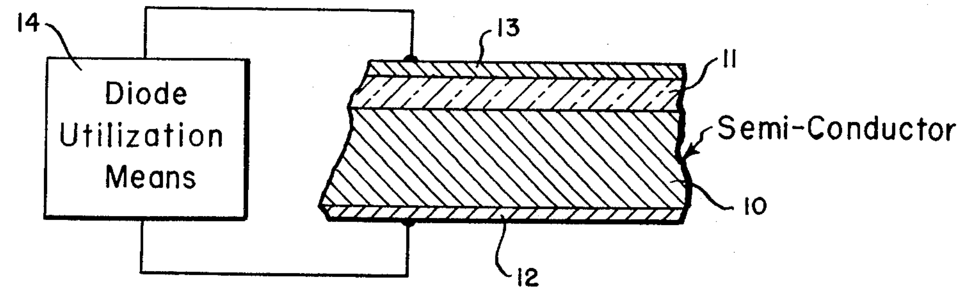
FIG. 1 is a schematic cross section of a glassy layer-crystalline semiconductor junction diode in accordance with the invention.

Referring to the drawings, FIG. 1 is a schematic cross section of a semiconductor diode employing a glassy amorphous material as an active layer in accordance with the invention. The device comprises a first active layer having one type of electronic conductivity such as a crystalline semiconductor substrate doped to exhibit either N-type or P-type conductivity. A thin, continuous active layer 11 of a glassy amorphous material possessing the other kind of conductivity is disposed adjacent the first active layer to form a diode junction with it. A pair of electrodes 12 and 13 are disposed in contact with the first active layer and the glassy layer, respectively, in order to provide an electrical path to diode utilization means 14. The utilization means can comprise either an integrated or a lumped parameter circuit which normally utilizes a diode in the electrical path between electrodes 12 and 13.

Insulating glassy amorphous materials (i.e., glassy materials having a specific resistivity at or above about $10^{12}$ ohm-cm) are preferred because they have insulating properties at least comparable with $SiO_2$ (the specific resistivity of which is about $10^{16}$ ohm-cm). Such materials can typically be used in place of $SiO_2$ as passivating layers in conjunction with conventional crystalline semiconductor devices or integrated circuits.

The glassy layer is sufficiently thin that the layer possesses useful conductivity. While the maximum thickness depends to some extent on the type of glassy material and the particular application, the layer should usually be sufficiently thin that the diode characteristics of the junction predominate over the resistive characteristics of the glassy material. In the usual case where an insulating glass is employed, the glass layer should typically be less than one and one-half microns thick and preferably less than one micron.

Preferably, the glassy layer is made of a glassy material which is ionically impermeable to ions of typical ambient materials, such as sodium, so that the device remains stable under a wide range of operating conditions. For this purpose, a glass layer may be defined as ionically impermeable if a capacitor using the layer as a dielectric does not show an appreciable shift in the room temperature capacitance-voltage characteristic after having been heated to the anticipated operating temperature in the presence of such materials and biased at the anticipated operating voltage for a period of 100 hours.

In general, glassy materials made predominantly from components forming ionically impermeable crystalline phases are also ionically impermeable. For example, in the case of glasses, it is known that certain compositions, such as $PbSiO_3$, $Pb_6Al_2SiO_{21}$, $ZnB_2O_4$ and $Zn_2SiO_4$, if cooled from a melt under equilibrium conditions, form crystalline phases which are ionically impermeable. Glasses made predominantly of one or more of these compositions are ionically impermeable for typical applications. Generally glasses comprising more than 50 mole per cent of such phases will be relatively good barriers to ionic contaminants, and glasses comprising 70 mole per cent or more are excellent barriers.

Especially preferred are insulating ionically impermeable glasses which are thermally compatible with typical crystalline semiconductor devices, that is, insulating glasses which have a temperature coefficient of expansion compatible with that of typical semiconductor substrates and have softening temperatures below the damage temperature of typical diffused junction semiconductor devices. These glasses are found, for example, among the lead-boro-alumino-silicates, the zinc-boro-silicates and the zinc-boro-alumino-silicates.

Specific examples of preferred glass compositions are given in Tables I – IV. For sedimentation depositions, the oxide components of the preferred glass composition are listed in Table I. Below each listed preferred percentage, is a range (in brackets) of acceptable percentages:

TABLE I

| | | |
|---|---|---|
| $SiO_2$ | 6.6 [3–12] | mole per cent |
| ZnO | 55.3 [45–65] | do. |
| PbO | 2.7 [0–6] | do. |
| $B_2O_3$ | 34.5 [25–40] | do. |
| $Al_2O_3$ | 1.0 [0–3] | do. |

where calcium oxide, barium oxide or strontium oxide or a mixture thereof can be substituted for ZnO in an amount up to 10 mole per cent.

An alternative and satisfactory composition for a glass for sedimentation deposition is given in Table II:

TABLE II

| | | |
|---|---|---|
| $SiO_2$ | 60 [55–65] | mole per cent |
| PbO | 35 [30–40] | do. |
| $Al_2O_3$ | 5 [0–7] | do. |

where $B_2O_3$, $V_2O_5$ or $P_2O_5$ or a mixture thereof can be substituted for $SiO_2$ and ZnO can be substituted for PbO, each substitution being limited to 20 mole per cent.

For RF sputtering deposition, the components for a preferred glass composition are listed in Table III:

TABLE III

| | | |
|---|---|---|
| $SiO_2$ | 46.15 [35–55] | mole per cent |
| PbO | 46.15 [35–60] | do. |
| $Al_2O_3$ | 7.70 [0–20] | do. |

where $B_2O_3$, $V_2O_5$ or $P_2O_5$ or a mixture thereof can be substituted for $SiO_2$ and ZnO can be substituted for PbO, each substitution limited to 20 mole per cent.

An alternative and satisfactory composition for a glass for either sedimentation or RF sputtering deposition is given in Table IV:

TABLE IV

| | | |
|---|---|---|
| $SiO_2$ | 10 [5–15] | mole per cent |
| ZnO | 55.5 [50–65] | do. |
| $B_2O_3$ | 34.5 [25–35 | do. |

where calcium oxide, barium oxide, strontium oxide or a mixture thereof can be substituted for ZnO in amounts up to 10 mole per cent, and PbO can be substituted for ZnO in amounts up to 20 mole per cent.

These glasses can be formed in accordance with conventional techniques well known in the art. (For preparing the glasses for sedimentation, see, for example, the technique described by W. A. Pliskin in U.S. Pat. No. 3,212,921 issued on Oct. 19, 1965.)

If it is desired to make glass layer 11 of submicron thickness (as might be required, for example, where the glass is also used as a dielectric layer in adjacent surface effect devices), the centrifuging technique disclosed in applicant's copending application, Ser. No. 859,012 filed Sept. 18, 1969, can be used to produce the thin glass layer.

It has been discovered that a number of glassy materials formed predominantly of polymeric, chain-forming members having semiconductive elements as their key cations, such as silicates and borates, can be rendered N-type or P-type semiconductors by melt doping with a suitable "impurity." Specifically, these glasses can be rendered N-type or P-type by adding to the melt formula impurities to donate or accept electrons in a manner analogous to the donation and acceptance of electrons by dopants in crystalline semiconductors. In particular, the impurities added to the melt are elements or compounds of elements which are donor or acceptor dopants for the key cation of the polymeric structure. For example, silicon is the key cation in a silicate glass and $B_2O_3$ is added to the glass melt to produce P-type conductivity. Similarly $P_2O_5$ or $V_2O_5$ is added to produce N-type conductivity. Boron is the key cation in a borate glass, and BeO produces P-type conductivity while $SiO_2$ produces N-type.

Preferably, the impurities are chosen to have approximately the same size as the key cations so that they can replace an appreciable proportion of the key cations in the glass structure. In such cases, the impurity ions can replace up to 20 mole per cent or more of the key cations without significantly altering the structure of the glass. A preferred "P-type" glass for use with N-doped silicon is a lead silicate glass having oxide components of PbO and $SiO_2$ in the mole ratio of 1:1 and including $B_2O_3$ in a proportion of up to 20 mole per cent. A preferred "N-type" glass for use with P-doped silicon is 1:1 PbO-$SiO_2$ glass which has been melted with $V_2O_5$ or $P_2O_5$ in a proportion of up to 20 mole percent.

The device of FIG. 1 can be conveniently fabricated by depositing a thin layer of glass on the crystalline substrate using the well-known sedimentation process. The electrodes can then be deposited by, for example, vacuum evaporation or sputtering.

As a specific example of such a device, a micron thick layer of the aforementioned 1:1 P-type glass was deposited on an N-doped silicon wafer by sedimentation. A thin layer of copper having a thickness of a few thousand angstroms was then deposited on the glass by vacuum evaporation and a conventional ohmic contact made with the silicon. The resulting structure acted as a diode having the current-voltage characteristics shown in FIG. 2. This structure is photosensitive, and it can therefore be used as a photodiode. Alternatively, the glass-semiconductor junction can be used as an insulting photoconductive element.

While the applicant does not claim to completely understand the phenomena underlying the operation of these glass devices and does not wish to be bound by any particular theory, it is believed that glassy amorphous materials, and particularly glasses, are composed of a polymeric structural member with short term order, but disordered and distorted. When the layer of glassy material is sufficiently thin, the electrical conduction phenomena related to the short term order in the material begin to predominate over those associated with the long term disorder, and thus the electronic conduction properties of the material can be utilized.

Figures 2, 3, 4:
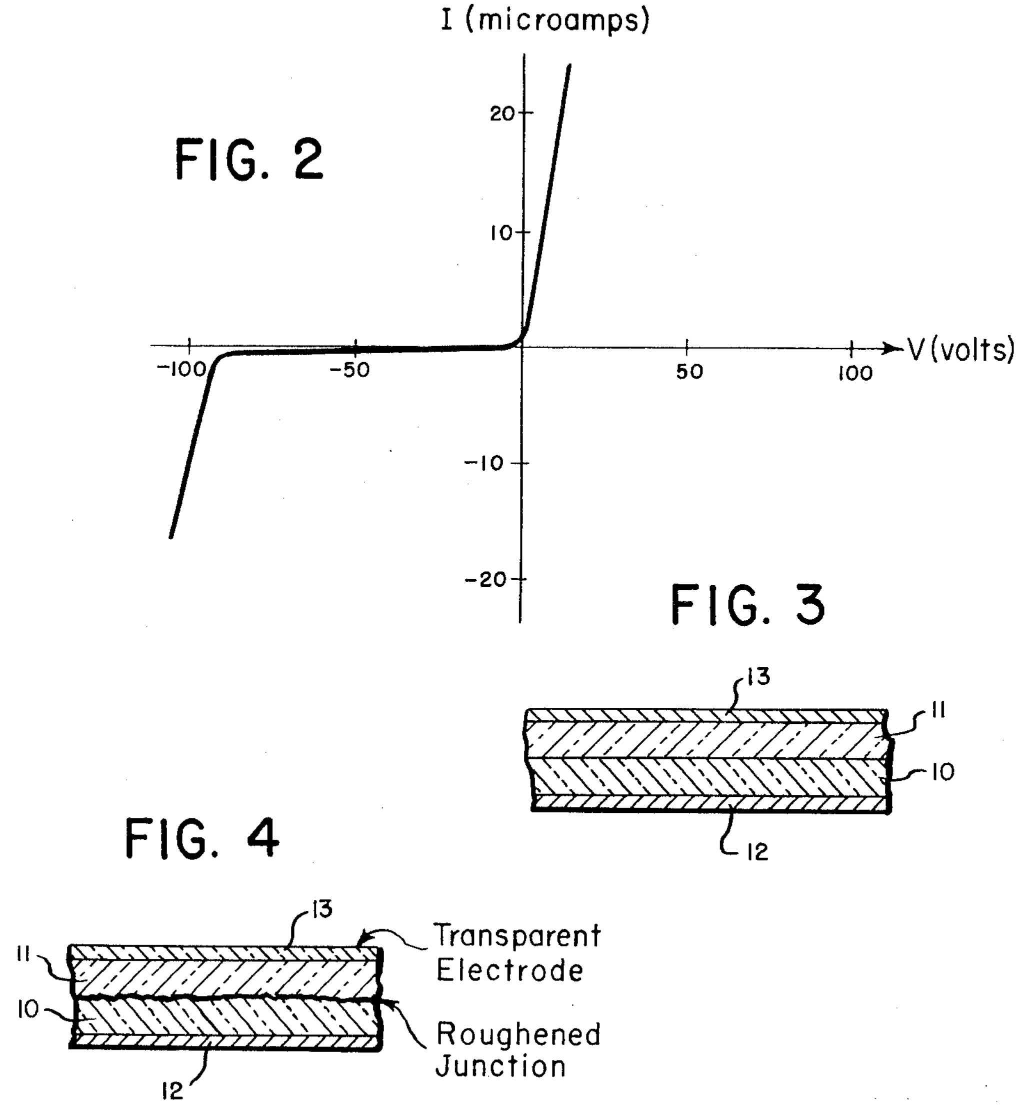
FIG. 2 is a graphical illustration showing the current-voltage characteristic of a typical diode in accordance with the invention.
FIG. 3 is a schematic cross section of a glassy layer-amorphous semiconductor junction diode.
FIG. 4 is a schematic cross section of a light emitting diode in accordance with the invention.

FIG. 3 is a schematic cross section of a glassy layer-amorphous semiconductor diode. The device is substantially identical with that of FIG. 1 except that crystalline semiconductor substrate 10 is replaced with a glassy amorphous semiconductor such as, for example, another thin layer of glass. Thus, for example, a diode is formed by depositing a first thin, continuous layer of glass having one type of conductivity on a conductive substrate and then depositing on the first glass layer a second continuous layer of a glass having the other type of conductivity. Specifically, the conductive substrate can be highly doped N-type silicon, the first glass layer can be the aforementioned 1:1 N-type glass and the second layer can be the aforementioned 1:1 P-type glass.

In an alternative multiple-junction structure comprising at least three successive active layers forming at least two junctions, the silicon substrate can be doped to one type of conductivity, the first glassy layer to the other type; and the second glassy layer to the same type as the silicon. Thus, a multiple-junction device can be formed, for example, by doping the silicon in the device of FIG. 3 to P-type conductivity. The resulting device behaves as a PNP junction device, exhibiting diode conductive characteristics for voltage of either polarity. Clearly a similar structure can be made using only a single active glass layer by disposing the layer on one of the active layers of a PN junction formed on the surface of a crystalline semiconductor substrate.

FIG. 4 is a schematic cross section of a light emitting diode in accordance with the invention. The device is substantially identical with those shown in FIGS. 1 and 2 except that the electrode contacting the glassy amorphous material is made of an optically transparent conductive material such as tin oxide. Advantageously, the glassy amorphous material is also optically transparent. The semiconductor substrate can be a crystalline or an amorphous semiconductor. Moreover, a polycrystalline semiconductor—specifically, silicon carbide—has been found to be particularly useful.

One significant advantage of this structutre over typical prior art light emitting diodes is that they can be made to produce greater light emission roughening the substrate to give the junction a roughened texture and thus to increase the light emitting surface area. Unlike the prior art diffused and epitaxially grown junctions, junctions in accordance with the present invention can be quite irregular since the glass layer forms a conformable coat over even an irregular substrate. Thus, the effective light-emitting area can be increased by simply roughening the substrate.

A second advantage of this structure is that the substrate can be shaped as a lens to produce a desired angular distribution of light.

A third advantage of these light emitting diodes is that they can be made to emit a wider spectral distribution of light than do typical prior art light-emitting diodes. This wide range of wavelengths is attributed to the wide range of electron energy levels in the glass.

Figure 5:
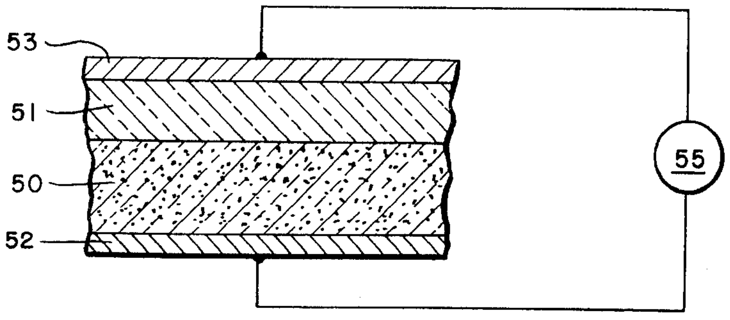
FIG. 5 is a schematic cross section of a glassy semiconductor-crystalline semiconductor diode especially adapted for use as a photoresponsive device.
Figure 6:
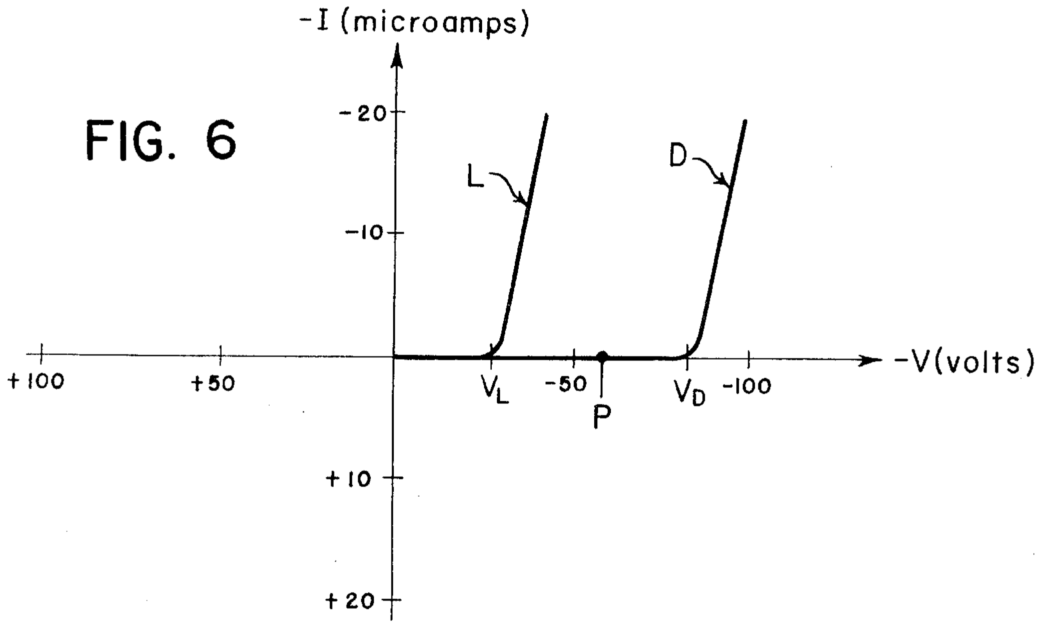
FIG. 6 is a graphical illustration showing the current-voltage characteristic of a typical diode of the form shown in FIG. 5.

FIG. 5 is a schematic cross section of a glassy junction diode which includes an active layer of glassy amorphous material forming the junction and which is adapted to operate as a photo-diode. The device comprises a semiconductor substrate 50 chosen to exhibit one type of conductivity (e.g., N-type conductivity), a glassy layer 51 disposed on the substrate 50 exhibiting the second type of conductivity (e.g., P-type), and a pair of electrodes 52 and 53 disposed in contact with the semiconductor and doped glass, respectively. Semiconductor substrate 50 can be a conventional crystalline semiconductor such as monocrystalline silicon, a polycrystalline semiconductor, or another doped glassy layer. One of the electrodes, conveniently electrode 53 can be formed of transparent conductive material such as tin oxide so that the glass-silicon junction can be exposed to light.

For the reasons previously discussed in detail, the preferred glassy amorphous material are the above-described insulating ion-impermeable glasses.

A specific example of such a diode will now be described in detail. A micron thick layer of the aforementioned 1:1 P-type glass was deposited on an N-doped silicon wafer by the well-known sedimentation process. A thin layer of copper having a thickness on the order of a few thousand angstroms was deposited on the glass by vacuum evaporation and a conventional ohmic contact made with the silicon. The structure acted as a diode.

As a second example, the substrate can comprise a thin layer of an N-type glass such as 1:1 PbO-$SiO_2$ glass melted with less than 15 mole per cent of $V_2O_5$ or with less than 15 mole per cent of $P_2O_5$. The P-type glassy material can be the above mentioned 1:1 P-type glass.

It has been found that these junction devices exhibit a reverse bias avalanche breakdown characteristic which is dependent upon the presence or absence of incident light. This characteristic can be seen by reference to FIG. 8 which shows both the light and the dark breakdown characteristics for a typical device. Specifically, Curve D shows the dark breakdown characteristic, and Curve L shows the characteristic in the presence of light. It should be noted that, in contrast with conventional crystalline semiconductor devices, applicant's junction device retains low values of leakage current in the presence of light up to the breakdown voltage. It should also be noted that by biasing the electrodes through biasing means 55 so that the voltage across the diode is at some point P between the light breakdown voltage $V_L$ and the dark breakdown voltage $V_D$ an extremely sensitive photodiode is produced. A second unique advantage of this device is the fact that visible light can readily penetrate the glassy layer to the junction region. Other more specialized devices can be produced which take advantage of other unique features of these junction devices.

Figure 7:
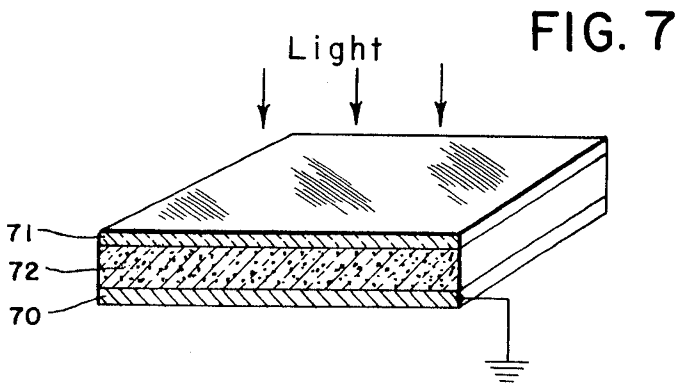
FIG. 7 illustrates a junction device for electrostatic reproduction.

FIG. 7 illustrates a second device useful as an electrostatic image reproducing element somewhat like a photoconductive plate. This element is similar to the junction device of FIG. 5 except that it has only one electrode 70. Specifically, the device comprises a layer 71 of the glassy amorphous material having one type of conductivity such as the above described 1:1 P-type glass, disposed upon a semiconductive substrate 72 having the other kind of conductivity, e.g., N-doped polycrystalline silicon. A layer of homogeneous glass of uniform thickness can be readily formed by the aforementioned sedimentation technique so that the plate has uniform electrical properties. A unique advantage of this junction device is the fact that, unlike conventional junction devices which are limited in area due to the presence of grain boundaries, it can cover sufficiently large areas to be useful in document reproduction.

This device can be used in electrostatic reproduction by applying a charge to the glassy amorphous layer (e.g., by corona charging as described in U.S. Pat. No. 2,741,959 issued to L. E. Walkup) to a sufficient potential that the voltage across the glassy layer is between the light and dark breakdown voltages. A 1 micron thick glass layer can be used with a charging voltage between 200 and 400 volts depending upon the type of glass.

The device can then be exposed to the projected image of an original to be copied. The deposited charge will flow through the junction in the light areas of the projected image and remain on the surface in the dark areas. The resultant image can be developed using development techniques, such as cascade development, well known in the art of xerography.

While the invention has been described in connection with a small number of specific embodiments, it is to be understood that these embodiments are merely illustrative of the many possible specific embodiments which can represent applications of the principles of the invention. As is well known, the diode junction is the basic building block in the fabrication of innumerable semiconductor devices. Thus, numerous and varied devices can be made by those skilled in the art without departing from the spirit and scope of the present invention.

I claim:

1. A multiple junction device of the type comprising at least three successive semiconducting layers of material, said successive layers of material having alternating types of electronic conductivity thereby forming at least two successive rectifying junctions thereamong, said device characterized in that at least one of said semiconducting layers is a layer of a glassy amorphous material.

2. A device according to claim 1 wherein said glassy amorphous material is glass.

3. A device according to claim 2 wherein said glassy amorphous material is an oxidic glass.

4. A device according to claim 1 wherein said glassy amorphous material is a material having a specific resistivity in excess of about $10^{12}$ ohm-cm.

5. A device according to claim 4 wherein said layer of glassy amorphous material has a thickness of less than about 1.5 microns.

6. A device according to claim 1 wherein said glassy amorphous material is a glass predominantly comprised of one or more phases selected from the group consisting of $Pb\ Si\ O_3$, $Pb_6\ Al_2\ Si_6\ O_{21}$, $Zn\ B_2\ O_4$ and $Zn_2\ Si\ O_4$.

7. A device according to claim 6 wherein said glass is comprised of at least 50 mole per cent of one or more phases selected from the group consisting of $Pb\ Si\ O_3$, $Pb_6\ Al_2\ Si_6\ O_{21}$, $Zn\ B_2\ O_4$ and $Zn_2\ Si\ O_4$.

8. A device according to claim 6 wherein said glass is comprised of at least 70 mole percent of one or more phases selected from the group consisting of $Pb\ Si\ O_3$, $Pb_6\ Al_2\ Si_6\ O_{21}$, $Zn\ B_2\ O_4$ and $Zn_2\ Si\ O_4$.

9. A device according to claim 1 wherein said glassy amorphous material is a glass selected from the group consisting of lead - boro - alumino - silicate glass, zinc - boro - alumino - silicate glass and zinc - boro - alumino - silicate glass

* * * * *